United States Patent
Choi

(10) Patent No.: US 10,312,272 B2
(45) Date of Patent: Jun. 4, 2019

(54) THIN FILM TRANSISTOR, ARRAY SUBSTRATE AND MANUFACTURING METHOD THEREOF, AND DISPLAY PANEL

(71) Applicant: BOE TECHNOLOGY GROUP CO., LTD., Beijing (CN)

(72) Inventor: Seungjin Choi, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/708,784

(22) Filed: Sep. 19, 2017

(65) Prior Publication Data

US 2018/0097023 A1    Apr. 5, 2018

(30) Foreign Application Priority Data

Sep. 30, 2016    (CN) .......................... 2016 1 0873680

(51) Int. Cl.
| | |
|---|---|
| *H01L 27/12* | (2006.01) |
| *H01L 29/417* | (2006.01) |
| *H01L 29/45* | (2006.01) |
| *H01L 29/786* | (2006.01) |
| *H01L 29/423* | (2006.01) |
| *G02F 1/1368* | (2006.01) |

(52) U.S. Cl.
CPC ........ *H01L 27/1288* (2013.01); *H01L 27/124* (2013.01); *H01L 27/1225* (2013.01); *H01L 27/1262* (2013.01); *H01L 29/41733* (2013.01); *H01L 29/42384* (2013.01); *H01L 29/45* (2013.01); *H01L 29/7869* (2013.01); *G02F 1/1368* (2013.01)

(58) Field of Classification Search
CPC ............. H01L 27/1288; H01L 29/7869; H01L 27/1262; H01L 27/124; H01L 29/45; H01L 29/41733; H01L 27/1225; G02F 1/1368

See application file for complete search history.

(56) References Cited

U.S. PATENT DOCUMENTS

2015/0280009 A1    10/2015    Kimura

FOREIGN PATENT DOCUMENTS

| CN | 103762165 A | 4/2014 |
|---|---|---|
| CN | 103762168 A | 4/2014 |
| CN | 104835851 A | 8/2015 |
| JP | 2011134910 A | 7/2011 |

OTHER PUBLICATIONS

Chinese office action dated May 2, 2017 for corresponding CN application 201610873680.7 with English translation attached.
Chinese search report dated Feb. 27, 2017 for corresponding CN application 201610873680.7 with English translation attached.

*Primary Examiner* — John P. Dulka
(74) *Attorney, Agent, or Firm* — Nath, Goldberg & Meyer; Joshua B. Goldberg; Tanya E. Harkins

(57) ABSTRACT

Provided is a thin film transistor, which comprises a gate electrode; a source electrode; and a drain electrode, wherein at least one electrode of the gate electrode, the source electrode and the drain electrode has a plurality of first grooves formed on an upper surface thereof. An array substrate, a display panel and a manufacturing method of an array substrate are also provided. In manufacturing the thin film transistor, the pattern is accurate and the yield is high.

17 Claims, 2 Drawing Sheets

THIN FILM TRANSISTOR, ARRAY SUBSTRATE AND MANUFACTURING METHOD THEREOF, AND DISPLAY PANEL

CROSS-REFERENCE TO RELATED APPLICATION

The present application claims priority to Chinese Patent Application No. 201610873680.7 filed on Sep. 30, 2016, entitled "Thin Film Transistor, Array Substrate, Manufacturing Method thereof, and Display Panel", the disclosure of which is hereby incorporated by reference in its entirety.

TECHNICAL FIELD

The present disclosure relates to a field of display technology, and particularly to a thin film transistor, an array substrate including the thin film transistor, a manufacturing method of the array substrate and a display panel including the array substrate.

BACKGROUND ART

In the prior art, an array substrate in a display apparatus is generally manufactured by using a lithography patterning process. Specifically, during forming a conductive pattern of the array substrate, steps as follows are performed: first forming a conductive material layer on an underlying structure by depositing, coating a photoresist layer on the conductive material layer and exposing and developing the photoresist layer, performing an etching process to form a conductive pattern layer, and peeling off the photoresist layer.

However, the photoresist may be peeled off during etching, resulting in that the final pattern formed by etching is inaccurate.

Therefore, how to prevent the photoresist from peeling off during etching has become a technical problem to be solved urgently in the art.

SUMMARY

An object of the present disclosure is to provide a thin film transistor, an array substrate including the thin film transistor, a manufacturing method of the array substrate and a display panel including the array substrate.

To achieve the above object, in a first aspect of the present disclosure, a thin film transistor is provided. The thin film transistor comprises a gate electrode; a source electrode; and a drain electrode, wherein at least one electrode among the gate electrode, the source electrode and the drain electrode has a plurality of first grooves formed in an upper surface thereof.

Optionally, the electrode having the plurality of first grooves formed in the upper surface thereof comprises: a main electrode layer; and a protection electrode layer provided above the main electrode layer, wherein the plurality of first grooves are formed in an upper surface of the protection electrode layer.

Optionally, the protection electrode layer comprises: a first protection electrode layer provided above the main electrode layer; a second protection electrode layer provided above the first protection electrode layer, wherein the first grooves are provided in a surface of the second protection electrode layer, composition of the second protection electrode layer is the same as that of the first protection electrode layer, and a density of the second protection electrode layer is smaller than that of the first protection electrode layer.

Optionally, a material of the main electrode layer includes copper, and materials of the first protection electrode layer and the second protection electrode layer include Mo—Nb alloy.

Optionally, the electrode having the plurality of first grooves formed in its upper surface further comprises: a third protection electrode layer provided below the main electrode layer, wherein a material of the third protection electrode layer is the same as that of the first protection electrode layer.

Optionally, both the source electrode and the drain electrode have the plurality of first grooves formed in upper surfaces thereof.

Optionally, the thin film transistor further comprises: an active layer provided below the source electrode and the drain electrode, wherein the active layer is an oxide semiconductor.

In a second aspect of the present disclosure, an array substrate is provided. The array substrate comprises a plurality of thin film transistors, wherein the thin film transistor is the above thin film transistor as provided in the present disclosure; and multiple groups of electrode lines including gate lines provided in a same layer as the gate electrode and data lines provided in a same layer as the source electrode and the drain electrode, wherein each electrode line of at least one group of electrode lines has a plurality of second grooves formed in an upper surface thereof.

In a third aspect of the present disclosure, an display panel is provided. The display panel comprises the above array substrate provided in the present disclosure.

As a fourth aspect of the present disclosure, a manufacturing method of an array substrate is provided. The array substrate comprises a plurality of gate lines and a plurality of data lines, the gate lines and the data lines are intersected with each other to divide the array substrate into a plurality of pixel units, each of which is provided therein with a thin film transistor, wherein the manufacturing method comprises steps of: forming a first pattern; and forming a second pattern, wherein the first pattern includes the gate lines and a pattern of gate electrodes of the thin film transistors, and the second pattern includes the data lines and a pattern of source electrodes and drain electrodes of the thin film transistors, and wherein at least one of the step of forming the first pattern and the step of forming the second pattern further comprises:

forming a conductive material layer;

forming a plurality of grooves in an upper surface of the conductive material layer;

coating a photoresist layer on the conductive material layer formed with the grooves;

exposing and developing the photoresist to form a shielding pattern on the upper surface of the conductive material layer; and etching the conductive material layer formed with the shielding pattern.

Optionally, the step of forming the conductive material layer further comprises:

forming a main conductive material layer; and forming a protection conductive material layer on the main conductive material layer, and wherein the step of forming the plurality of grooves in the upper surface of the conductive material layer further comprises:

forming the plurality of grooves in a upper surface of the protection conductive material layer.

Optionally, the protection conductive material layer includes a first protection conductive material layer and a second protection conductive material layer, and the step of forming the protection conductive material layer further comprises:

forming the first protection conductive material layer on the main conductive material layer; and forming the second protection conductive material layer on the first protection conductive material layer, wherein composition of the first protection conductive material layer is the same as that of the second protection conductive material layer, and a density of the second protection conductive material layer is smaller than that of the first protection conductive material layer, and wherein the step of forming the plurality of grooves in the upper surface of the conductive material layer further comprises:

forming the plurality of grooves in an upper surface of the second protection conductive material layer.

Optionally, the first protection conductive material layer and the second protection conductive material layer are formed using a same target material by sputtering, a sputtering power for forming the first protection conductive material layer is smaller than that for forming the second protection conductive material layer, and a chamber pressure for forming the first protection conductive material layer is larger than that for forming the second protection conductive material layer.

Optionally, a material of the main conductive material layer includes copper, materials of the first protection conductive material layer and the second protection conductive material layer include Mo—Nb alloy;

during forming the first protection conductive material layer, the sputtering power ranges from 4 kW to 5 kW, and the chamber pressure ranges from 0.2 Pa to 0.3 Pa; and during forming the second protection conductive material layer, the sputtering power ranges from 6 kW to 7 kW, and the chamber pressure ranges from 0.1 Pa to 0.2 Pa, and wherein the step of forming the plurality of grooves in the upper surface of the protection conductive material layer further comprises:

introducing a process gas into a chamber, wherein the process gas includes a hydrogen fluoride gas, a volume content of the hydrogen fluoride gas in the process gas is between 1% and 10%, and duration for introducing the process gas ranges from 3 s to 5 s.

Optionally, the pattern having the plurality of grooves formed in an upper surface thereof is a source-drain pattern, wherein before forming the source-drain pattern, the manufacturing method further comprises a step of:

forming an active material layer made of oxide semiconductor material;

performing an exposure and a development on the photoresist layer by using a half tone mask in the step of exposing and developing the photoresist to form the shielding pattern, wherein the shielding pattern includes an active shielding pattern, a region covered by the active shielding pattern coincides with the pattern of the active material layer, and the active shielding pattern includes a source electrode region, a drain electrode region and an interval region between the source electrode region and the drain electrode region, a thickness of the interval region is smaller than those of the source electrode region and the drain electrode region;

the step of etching the conductive material layer formed with the shielding pattern further comprises:

wet etching the conductive material layer and the active material layer so as to obtain an intermediate pattern including the active layer and an intermediate conductive pattern covered on the active layer; and ashing the shielding pattern to etch the interval region, and further etching the intermediate conductive pattern, so that the intermediate conductive pattern is broken at a position corresponding to the interval region to form the source electrode and the drain electrode.

Optionally, before the step of forming the main conductive material layer, the step of forming the conductive material layer further comprises a step of:

forming a third protection conductive material layer, wherein the main conductive material layer is formed on the third protection conductive material layer.

In manufacturing the thin film transistor, during etching the conductive material layer, since a part of the photoresist is filled into the first grooves, the photoresist is not easily to peel off from the upper surface of the conductive material layer, so that an accurate conductive pattern can be obtained.

BRIEF DESCRIPTION OF THE DRAWINGS

The accompanying drawings are intended to provide further understanding of the present invention and form part of the specification, and are used for illustrating rather than limiting the present invention, together with specific implementations below. In the drawings.

REFERENCE NUMERALS

Figure 1:
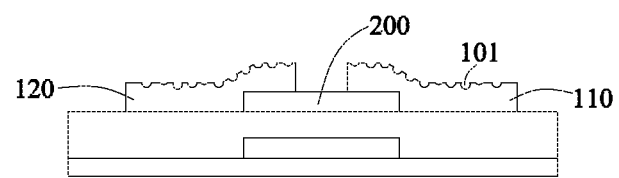
FIG. 1 is a schematic diagram of a first implementation of a thin film transistor provided by the present disclosure.

110: source electrode
111, 121: main electrode layer
112, 122: first protection electrode layer
113, 123: second protection electrode layer
114 124: third protection electrode layer
120: drain electrode
200: active layer
310: main conductive material layer
321: first protection conductive material layer
322: second protection conductive material layer
330: third protection conductive material layer
340: photoresist layer 341: shielding pattern
101: first groove

DETAILED DESCRIPTION OF THE EMBODIMENTS

Specific embodiments of the present invention are described in detail below in conjunction with the accompanying drawings. It should be understood that the specific embodiments described here are only used for illustrating and explaining the present invention, instead of limiting the present invention.

Orientation words "up"and "down" refer to an "upward" direction and a "downward" direction in drawings.

According to one aspect of the present disclosure, a thin film transistor is provided, as shown in FIG. 1, which comprises a gate electrode; a source electrode; and a drain electrode, wherein at least one electrode among the gate electrode, the source electrode and the drain electrode has a plurality of first grooves formed in an upper surface thereof.

The plurality of first grooves in the upper surface of at least one of the gate electrode, the source electrode and the drain electrode may be formed by a patterning process. Furthermore, forming the gate electrode, the source electrode or the drain electrode having the first grooves formed in the upper surface thereof by a patterning process may includes following steps of:

forming a conductive material layer;

forming a plurality of first grooves in the upper surface of the conductive material layer;

coating a photoresist on the conductive material layer formed with the first grooves, wherein a part of the photoresist is filled into the first grooves;

exposing and developing the photoresist to form a shielding pattern on the conductive material layer; and etching the conductive material layer to form a conductive pattern.

It should be appreciated that the pattern formed after etching the conductive material layer may be the gate electrode, the source electrode or the drain electrode.

During etching the conductive material layer, since a part of the photoresist is filled into the first grooves, the photoresist is not easily to peel off from the upper surface of the conductive material layer, so that an accurate conductive pattern can be obtained.

In the embodiment shown in FIG. 1, the first grooves 101 are formed in upper surfaces of the source electrode 110 and the drain electrode 120. When forming the source electrode and the drain electrode, the photoresist may be partially filled into the first grooves, thus it will not be peeled off in a subsequent etching process.

In order to increase conductivity of the conductive pattern, the gate electrode, the source electrode and the drain electrode are generally formed of a material with lower conductivity.

Optionally, in the present embodiment, an upper surface of the conductive material layer is formed with the plurality of first grooves therein.

Since the material with lower resistivity is usually more active, it is easy to be oxidized during manufacturing, therefore, optionally, the electrode having the plurality of grooves formed in an upper surface thereof may include a main electrode layer and a protection electrode layer formed on an upper surface of the main electrode layer. The plurality of first grooves are formed in an upper surface of the protection electrode layer. The main electrode layer may be formed of materials with low resistivity (for example, copper), and the protection electrode layer may be formed of materials not easy to be oxidized (for example, Mo—Nb alloy).

For ease of the manufacture, optionally, the protection electrode layer includes a first protection electrode layer provided on a surface of the main electrode layer and a second protection electrode layer provided on a surface of the first protection electrode layer. The first grooves are provided in a surface of the second protection electrode layer, composition of the second protection electrode layer is the same as that of the first protection electrode layer, and a density of the second protection electrode layer is smaller than that of the first protection electrode layer.

Generally, the first protection electrode layer and the second protection electrode layer may be formed respectively by using a same target material through a sputtering process. During forming the first protection electrode layer and the second protection electrode layer, since process parameters are different, the density of the second protection electrode layer may be made smaller than that of the first protection electrode layer despite of the same target material. How to form the first protection electrode layer and the second protection electrode layer will be described in detail below, and will not be described here. Since the density of the second protection electrode layer is small, spaces between molecules are large, causing the second protection electrode layer to be similar to a porous material, therefore, it is easy to form the first grooves in the surface of the second protection electrode layer.

As described above, optionally, the material of the main electrode layer includes copper, and the materials of the first protection electrode layer and the second protection electrode layer include Mo—Nb alloy.

In order to prevent oxygen atoms in a layer adjacent to the main conductive pattern from oxidizing the main electrode layer of the electrode having the first grooves formed in the surface thereof, optionally, the electrode having the first grooves formed in the surface thereof further comprising a third protection electrode layer provided below the main electrode layer, wherein a material of the third protection electrode layer is the same as that of the first protection electrode layer.

The thin film transistor provided in the present disclosure may be an oxide thin film transistor formed by a back channel etching.

Figure 2:
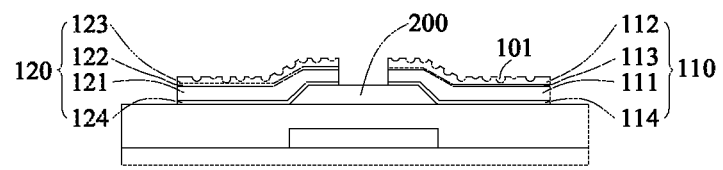
FIG. 2 is a schematic diagram of a second implementation of a thin film transistor provided by the present disclosure.

Specifically, as shown in FIGS. 1 and 2, the thin film transistor comprises an active layer 200 provided below the source electrode and the drain electrode, the active layer 200 is an oxide semiconductor, for example, the active layer 200 may be made of an oxide such as IGZO.

In the embodiments shown in FIGS. 1 and 2, the source electrode pattern and the drain electrode pattern are conductive patterns having the first grooves 101 formed in upper surfaces thereof. In the embodiment shown in FIG. 2, the source electrode 110 comprises a third protection electrode layer 114, a main electrode layer 111, a first protection electrode layer 113 and a second protection electrode layer 112, and an upper surface of the second protection electrode layer 112 is formed with a plurality of first grooves 101 therein. The drain electrode 120 comprises a third protection electrode layer 124, a main electrode layer 121, a first protection electrode layer 122 and a second protection electrode layer 123, and an upper surface of the second protection electrode layer 123 is formed with a plurality of first grooves therein.

Since the source electrode and the drain electrode are formed with the plurality of first grooves therein, during manufacturing the thin film transistor shown in FIG. 1 or 2 in which the active layer is formed of an oxide by using the back channel etching method, it is unnecessary to manufacture the etching stopping layer, reducing the cost of the thin film transistor.

Specifically, a method for manufacturing the thin film transistor shown in FIG. 1 or 2 may comprise steps of:

forming a conductive material layer;

forming a plurality of first grooves in an upper surface of the conductive material layer;

coating a photoresist layer on the conductive material layer formed with the grooves;

exposing and developing the photoresist by using a half tone mask to form a shielding pattern, wherein a shape of a region covered by the shielding pattern coincides with that of the active layer;

wet etching the conductive material layer formed with the shielding pattern to obtain an intermediate pattern;

ashing the shielding pattern to etch off a part of the intermediate pattern corresponding to an interval region between the source electrode and the drain electrode.

During performing wet etching on the conductive material layer, the shielding pattern is not easily to peel off, and during ashing the shielding pattern, the photoresist corresponding to the source electrode and the drain electrode is also not easily to peel off.

Therefore, in the thin film transistor provided in the present disclosure, the shape of the conductive pattern may be more accurate, so that the yield of the thin film transistors is high. Furthermore, since no etching stopping layer exists in the thin film transistor, the cost of the thin film transistor may be reduced.

According to another aspect of the present disclosure, an array substrate is provided, The array substrate comprises thin film transistors, wherein the thin film transistor is the above thin film transistor provided in the present disclosure. The array substrate further comprises multiple groups of electrode lines, each group of electrode lines comprises a plurality of electrode lines, and at least one group of electrode lines have a plurality of second grooves formed on the upper surfaces thereof.

It should be noted that some groups of electrode lines may be in a same layer as the gate electrodes, and the other groups of electrode lines may be in a same layer as the source electrodes and the drain electrodes. Specifically, among the groups of electrode lines, one group of electrode lines are gate lines located in a same layer as the gate electrodes, and another group of electrode lines are data lines located in a same layer as the source electrodes and the drain electrodes.

In a case that the gate electrode comprises a plurality of first grooves in its upper surface, the gate line also comprises a plurality of second grooves in its upper surface. In a case that the source electrode and the drain electrode comprise a plurality of first grooves in their upper surfaces, the data line also comprises a plurality of second grooves in its upper surface.

Similar to the thin film transistor above, since the electrodes have the first grooves formed in their upper surfaces and the electrode lines have the second grooves formed in their upper surfaces, when manufacturing the array substrate by using the lithography patterning process, the electrodes and the electrode lines with accurate shapes may be obtained, thus the yield of manufacturing the array substrate can be increased.

According to yet another aspect of the present disclosure, a display panel is provided. The display panel comprises an array substrate, which is the array substrate provided in the above embodiment of the present disclosure.

As described above, in the array substrate, the electrodes and the electrode lines are accurate, the yield is high, therefore, the yield of the display panel can be high.

The display panel may be a liquid crystal display panel. Accordingly, the display panel may further comprise an opposite substrate to be assembled with the array substrate and a liquid crystal material layer between the array substrate and the opposite substrate.

Figure 3A:
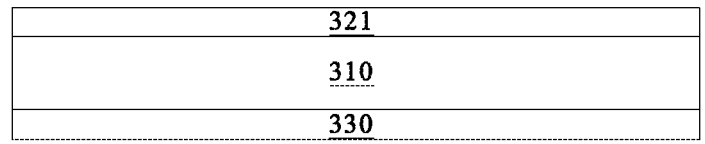
FIG. 3a is a schematic diagram illustrating the process of forming a main conductive material layer and a first protection conductive material layer in a manufacturing method of an array substrate provided in the present disclosure.
Figure 3B:
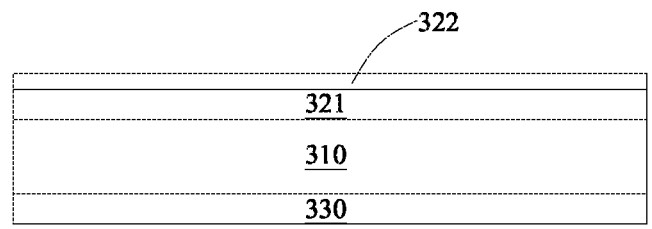
FIG. 3b is a schematic diagram of a conductive material layer formed by the manufacturing method of the array substrate provided in the present disclosure.
Figure 3C:
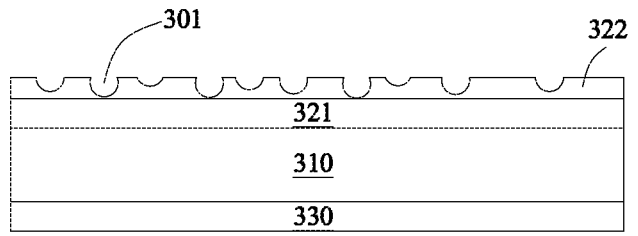
FIG. 3c is a schematic diagram illustrating the process of forming a plurality of grooves in an upper surface of the conductive material layer in the manufacturing method of the array substrate provided in the present disclosure.
Figure 3D:
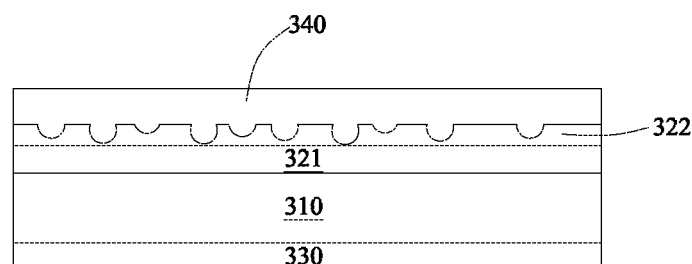
FIG. 3d is a schematic diagram illustrating the process of providing a photoresist layer on the conductive material layer in the manufacturing method of the array substrate provided in the present disclosure.
Figure 3E:
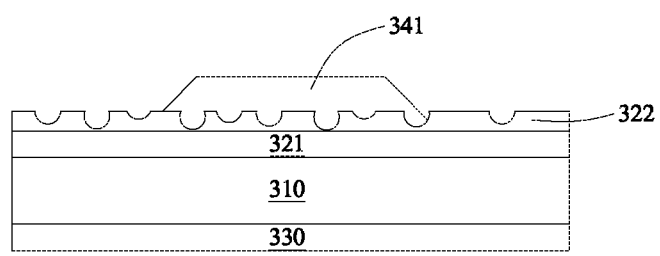
FIG. 3e is a schematic diagram of a shielding pattern formed by exposing and developing the photoresist layer in the manufacturing method of the array substrate provided in the present disclosure.

According to yet another aspect of the present disclosure, a manufacturing method of an array substrate is provided, wherein the array substrate comprises: a plurality of gate lines and a plurality of data lines, the gate lines and the data lines are intersected with each other to divide the array substrate into a plurality of pixel units, each of which is provided therein with a thin film transistor, wherein the manufacturing method includes: forming a first pattern; and forming a second pattern, wherein the first pattern includes the gate lines and a pattern of gate electrodes of the thin film transistors, and the second pattern includes the data lines and a pattern of source electrodes and drain electrodes of the thin film transistors, and wherein at least one of the step of forming the first pattern and the step of forming the second pattern comprises:

forming a conductive material layer, as shown in FIG. 3*b;* forming a plurality of grooves 301 in an upper surface of the conductive material layer, as shown in FIG. 3*c;* coating a photoresist layer 340 on the conductive material layer formed with grooves 301, as shown in FIG. 3*d;* exposing and developing the photoresist to form a shielding pattern 341 on the upper surface of the conductive material layer, as shown in FIG. 3*e;* and etching the conductive material layer formed with the shielding pattern.

The conductive material layer may be used to form the first pattern, and may also be used to form the second pattern. A manufacturer may determine, as needed, whether the pattern being formed by etching the conductive material layer formed with the shielding pattern is the first pattern or the second pattern.

As described above, during manufacturing the array substrate, since the conductive material layer is formed with grooves therein, when coating the photoresist on the conductive material layer, the photoresist can be filled into the grooves. Therefore, the photoresist will be more firmly attached to the upper surface of the conductive material layer. In the etching process, the shielding pattern obtained after development will also be firmly attached to the conductive material layer so as to obtain a more accurate pattern.

Similar to the above description of the thin film transistor, in order to allow the conductive pattern to have excellent conductive performance and prevent the conductive pattern from being excessively oxidized during manufacturing, optionally, the step of forming the conductive material layer further comprises:

forming a main conductive material layer 310; and forming a protection conductive material layer on the main conductive material layer 310.

In addition, the step of forming a plurality of grooves in an upper surface of the conductive material layer further comprises:

forming a plurality of grooves in an upper surface of the protection conductive material layer.

A resistivity of the main conductive material layer 310 is smaller than that of the protection conductive material layer, and the oxidation resistance of the protective conductive material layer is higher than that of the main conductive material layer 310.

In order to facilitate forming the plurality of grooves 301, optionally, the protection conductive material layer includes a first protection conductive material layer 321 and a second protection conductive material layer 322, and accordingly, the step of forming the protection conductive material layer further comprises:

forming the first protection conductive material layer 321 on an upper surface of the main conductive material layer 310; and forming the second protection conductive material layer 322 on an upper surface of the first protection conductive material layer 321, wherein composition of the first protection conductive material layer 321 is the same as that of the second protection conductive material layer 322, and a density of the second protection conductive material layer 322 is smaller than that of the first protection conductive material layer 321, and wherein the step of forming the plurality of grooves 301 in the upper surface of the conductive material layer further comprises:

forming the plurality of grooves 301 in an upper surface of the second protection conductive material layer 322.

The composition of the second protection conductive material layer 322 is the same as that of the first protection conductive material layer 321 and the density of the second protection conductive material layer 322 is smaller than that of the first protection conductive material layer 321, indicating that there are spaces between molecules of the second protection conductive material layer, thus the second protection conductive material layer 322 is equivalent to a porous material, which is more easily corroded to form the grooves 301.

As described above, the composition of the second protection conductive material layer 322 is the same as that of the first protection conductive material layer 321, therefore, optionally, the first protection conductive material layer 321 and the second protection conductive material layer 322 may be formed respectively by using a same target material, and a sputtering power for forming the first protection conductive material layer 321 is smaller than that for forming the second protection conductive material layer 322, and a chamber pressure for forming the first protection conductive material layer 321 is larger than that for forming the second protection conductive material layer 322.

For example, in an implementation, a material of the main conductive material layer includes copper, materials of the first protection conductive material layer and the second protection conductive material layer include Mo—Nb alloy. Accordingly, during forming the first protection conductive material layer, the sputtering power ranges from 4 kW to 5 kW, and the chamber pressure ranges from 0.2 Pa to 0.3 Pa.

During forming the second protection conductive material layer, the sputtering power ranges from 6 kW to 7 kW, and the chamber pressure ranges from 0.1 Pa to 0.2 Pa.

The step of forming a plurality of grooves in the upper surface of the protection conductive material layer further comprises: introducing a process gas into a chamber, wherein the process gas includes a hydrogen fluoride (HF) gas. HF gas may corrode the surface of the second protection conductive material layer 322 to form the grooves 301.

To void the first protection conductive material layer from being etched, optionally, a volume content of the hydrogen fluoride gas in the process gas is between 1% and 10%, and duration for introducing the process gas ranges from 3 s to 5 s.

Optionally, in this embodiment, the pattern having the plurality of grooves formed in the upper surface thereof is the second pattern, and before forming the second pattern, the manufacturing method further comprises a step of:

forming an active material layer made of oxide semiconductor material (for example, IGZO).

In addition, in this embodiment, the step of exposing and developing the photoresist comprises: performing an exposure and a development on the photoresist layer by using a half tone mask to form the shielding pattern, wherein the shielding pattern includes an active shielding pattern, a region covered by the active shielding pattern coincides with the pattern of the active material layer, and the active shielding pattern includes a source electrode region, a drain electrode region and an interval region between the source electrode region and the drain electrode region, a thickness of the interval region is smaller than those of the source electrode region and the drain electrode region, Optionally, in this embodiment, the step of etching the conductive material layer formed with the shielding pattern comprises:

wet etching the conductive material layer and the active material layer so as to obtain an intermediate pattern including the active layer and an intermediate conductive pattern covered on the active layer; and ashing the shielding pattern to etch the interval region, and further etching the intermediate conductive pattern, so that the intermediate conductive pattern is broken at a position corresponding to the interval region to form the source electrode and the drain electrode.

Since the photoresist can be firmly attached to the upper surface of the conductive material layer, the shielding pattern formed after the exposing and the developing may be firmly attached to the upper surface of the conductive material layer. During wet etching the conductive material layer, the shielding pattern will not be peeled off, furthermore, during the subsequent ashing process, parts of the shielding pattern in the drain electrode region and the source electrode region will not be peeled off either, thus an array substrate with accurate pattern can be obtained, therefore the yield of the array substrate can be increased.

It should be noted that, the shielding pattern further comprises a data line shielding pattern provided above the data lines.

Furthermore, by forming grooves in the upper surface of the conductive material layer, the oxide thin film transistor may be manufactured by using the back channel etching method, and it is unnecessary to manufacture the etching stopping layer, reducing the cost of the thin film transistor.

As described above, the active layer may be made of an oxide. In order to prevent oxygen atoms in the active from diffusing into the conductive patter layer, optionally, before the step of forming the main conductive material layer, the step of forming the conductive material layer further comprises a step of:

forming a third protection conductive material layer.

In this embodiment, the main conductive material layer is formed on the third protection conductive material layer.

In this embodiment, the material of the third protection conductive material layer may be the same as those of the first protection conductive material layer and the second protection conductive material layer, and may be Mo—Nb alloy.

It should be noted that, only improvements to the prior art are described herein, and well known structures in the prior art are not specifically described. For example, during describing the step of forming the conductive material layer with reference to FIG. 3b, it is not particularly limited on which structure the conductive material is formed; in other words, in a case that the conductive layer is used to form the source electrode and the drain electrode, the conductive material layer may be formed on the active material layer.

It should be understood that the above embodiments are only exemplary embodiments for illustrating the principle of the present invention; however, the present invention is not limited thereto. For those of one of ordinary skill in the art, various modifications and improvements can be made without departing from the spirit and essence of the present invention, and these modifications and improvements are also encompassed within the protection scope of the present invention.

The invention claimed is:

1. A thin film transistor comprising:
a gate electrode;
a source electrode; and
a drain electrode, wherein
at least one electrode among the gate electrode, the source electrode and the drain electrode has a plurality of first grooves formed in an upper surface thereof,
wherein the electrode having the plurality of first grooves formed in the upper surface thereof comprises:
a main electrode layer; and
a protection electrode layer provided above the main electrode layer, wherein
the plurality of first grooves are formed in an upper surface of the protection electrode layer.

2. The thin film transistor of claim 1, wherein the protection electrode layer comprises:
a first protection electrode layer provided above the main electrode layer; and
a second protection electrode layer provided above the first protection electrode layer, wherein
the first grooves are provided in a surface of the second protection electrode layer, composition of the second protection electrode layer is the same as that of the first protection electrode layer, and a density of the second protection electrode layer is smaller than that of the first protection electrode layer.

3. The thin film transistor of claim 2, wherein a material of the main electrode layer includes copper, and materials of the first protection electrode layer and the second protection electrode layer include Mo—Nb alloy.

4. The thin film transistor of claim 2, wherein the electrode having the plurality of first grooves formed in the upper surface thereof further comprises:
a third protection electrode layer provided below the main electrode layer, wherein
a material of the third protection electrode layer is the same as that of the first protection electrode layer.

5. The thin film transistor of claim 1, wherein both the source electrode and the drain electrode have the plurality of first grooves formed in upper surfaces thereof.

6. The thin film transistor of claim 5, further comprising:
an active layer provided below the source electrode and the drain electrode, wherein
the active layer is an oxide semiconductor.

7. An array substrate comprising:
a plurality of thin film transistors, wherein each thin film transistor of the plurality of thin film transistors is the thin film transistor of claim 1; and
multiple groups of electrode lines including gate lines provided in a same layer as the gate electrode and data lines provided in a same layer as the source electrode and the drain electrode, wherein each electrode line of at least one group of electrode lines has a plurality of second grooves formed in an upper surface thereof,
wherein each thin film transistor further comprises an active layer, and the active layer is in contact with the drain electrode and the source electrode.

8. The array substrate of claim 7, wherein the protection electrode layer comprises a first protection electrode layer provided above the main electrode layer, and a second protection electrode layer provided above the first protection electrode layer, wherein the first grooves are provided in a surface of the second protection electrode layer, composition of the second protection electrode layer is the same as that of the first protection electrode layer, and a density of the second protection electrode layer is smaller than that of the first protection electrode layer.

9. A display panel comprising an array substrate, wherein the array substrate comprises:
a plurality of thin film transistors, wherein for each thin film transistor of the plurality of thin film transistors, the thin film transistor comprises a gate electrode, a source electrode, and a drain electrode, wherein at least one electrode among the gate electrode, the source electrode and the drain electrode has a plurality of first grooves formed in an upper surface thereof, and wherein the electrode having the plurality of first grooves formed in the upper surface thereof comprises a main electrode layer and a protection electrode layer provided above the main electrode layer, wherein the plurality of first grooves are formed in an upper surface of the protection electrode layer; and
multiple groups of electrode lines including gate lines provided in a same layer as the gate electrode and data lines provided in a same layer as the source electrode and the drain electrode, Wherein each electrode line of at least one group of electrode lines has a plurality of second grooves formed in an upper surface thereof.

10. The display panel of claim 9 wherein the protection electrode layer comprises a first protection electrode laver provided above the main electrode laver, and a second protection electrode layer provided above the first protection electrode layer, wherein the first grooves are provided in a surface of the second protection electrode layer, composition of the second protection electrode layer is the same as that of the first protection electrode layer, and a density of the second protection electrode layer is smaller than that of the first protection electrode layer.

11. A manufacturing method of an array substrate, wherein the array substrate comprises a plurality of gate lines and a plurality of data lines, the gate lines and the data lines are intersected with each other to divide the array substrate into a plurality of pixel units, each of which is provided therein with a thin film transistor, wherein the manufacturing method comprises steps of:
forming a first pattern; and
forming a second pattern, wherein
the first pattern includes the gate lines and a pattern of gate electrodes of the thin film transistors, and the second pattern includes the data lines and a pattern of source electrodes and drain electrodes of the thin film transistors, and wherein
at least one of the step of forming the first pattern and the step of forming the second pattern further comprises:
forming a conductive material layer;

forming a plurality of grooves in an upper surface of the conductive material layer;
coating a photoresist layer on the conductive material layer formed with the grooves;
exposing and developing the photoresist to form a shielding pattern on the upper surface of the conductive material layer; and
etching the conductive material layer formed with the shielding pattern.

12. The manufacturing method of claim 11, wherein the step of forming the conductive material layer further comprises:
forming a main conductive material layer; and
forming a protection conductive material layer on the main conductive material layer, and wherein
the step of forming the plurality of grooves in the upper surface of the conductive material layer further comprises:
forming the plurality of grooves in a upper surface of the protection conductive material layer.

13. The manufacturing method of claim 12, wherein the protection conductive material layer includes a first protection conductive material layer and a second protection conductive material layer, and the step of forming the protection conductive material layer further comprises:
forming the first protection conductive material layer on the main conductive material layer; and
forming the second protection conductive material layer on the first protection conductive material layer, wherein composition of the first protection conductive material layer is the same as that of the second protection conductive material layer, and a density of the second protection conductive material layer is smaller than that of the first protection conductive material layer, and wherein
the step of forming the plurality of grooves in the upper surface of the conductive material layer further comprises:
forming the plurality of grooves in an upper surface of the second protection conductive material layer.

14. The manufacturing method of claim 13, wherein the first protection conductive material layer and the second protection conductive material layer are formed using a same target material by sputtering, a sputtering power for forming the first protection conductive material layer is smaller than that for forming the second protection conductive material layer, and a chamber pressure for forming the first protection conductive material layer is larger than that for forming the second protection conductive material layer.

15. The manufacturing method of claim 14, wherein
a material of the main conductive material layer includes copper, materials of the first protection conductive material layer and the second protection conductive material layer include Mo—Nb alloy;

during forming the first protection conductive material layer, the sputtering power ranges from 4 kW to 5 kW, and the chamber pressure ranges from 0.2 Pa to 0.3 Pa; and
during forming the second protection conductive material layer, the sputtering power ranges from 6 kW to 7 kW, and the chamber pressure ranges from 0.1 Pa to 0.2 Pa, and wherein
the step of forming the plurality of grooves in the upper surface of the protection conductive material layer further comprises:
introducing a process gas into a chamber, wherein the process gas includes a hydrogen fluoride gas, a volume content of the hydrogen fluoride gas in the process gas is between 1% and 10%, and duration for introducing the process gas ranges from 3 s to 5 s.

16. The manufacturing method of claim 11, wherein the pattern having the plurality of grooves formed in the upper surface thereof is a source-drain pattern, wherein before forming the source-drain pattern, the manufacturing method further comprises a step of:
forming an active material layer made of oxide semiconductor material;
performing an exposure and a development on the photoresist layer by using a half tone mask in the step of exposing and developing the photoresist to form the shielding pattern, wherein the shielding pattern includes an active shielding pattern, a region covered by the active shielding pattern coincides with the pattern of the active material layer, and the active shielding pattern includes a source electrode region, a drain electrode region and an interval region between the source electrode region and the drain electrode region, a thickness of the interval region is smaller than those of the source electrode region and the drain electrode region;
the step of etching the conductive material layer formed with the shielding pattern further comprises:
wet etching the conductive material layer and the active material layer so as to obtain an intermediate pattern including the active layer and an intermediate conductive pattern covered on the active layer; and
ashing the shielding pattern to etch the interval region, and further etching the intermediate conductive pattern, so that the intermediate conductive pattern is broken at a position corresponding to the interval region to form the source electrode and the drain electrode.

17. The manufacturing method of claim 16, wherein, before the step of forming the main conductive material layer, the step of forming the conductive material layer further comprises a step of:
forming a third protection conductive material layer, wherein
the main conductive material layer is formed on the third protection conductive material layer.

* * * * *